(12) United States Patent
Waltari

(10) Patent No.: US 11,444,819 B1
(45) Date of Patent: Sep. 13, 2022

(54) ADAPTIVE DIGITAL RECEIVER PATH LINEARIZER

(71) Applicant: IQ-Analog Corporation, San Diego, CA (US)

(72) Inventor: Mikko Waltari, Escondido, CA (US)

(73) Assignee: IQ-Analog Corp., San Diego, CA (US)

(*) Notice: Subject to any disclaimer, the term of this patent is extended or adjusted under 35 U.S.C. 154(b) by 0 days.

(21) Appl. No.: 17/827,730

(22) Filed: May 29, 2022

(51) Int. Cl.
    H04W 88/02 (2009.01)
    H04L 27/36 (2006.01)
    H03F 1/32 (2006.01)
    H04B 1/04 (2006.01)

(52) U.S. Cl.
    CPC ......... H04L 27/368 (2013.01); H03F 1/3223 (2013.01); H04B 1/0475 (2013.01); H04W 88/02 (2013.01)

(58) Field of Classification Search
    CPC ............. H04W 88/02; H04W 72/0413; H04W 72/042; H04W 72/0453; H04W 52/346; H04W 52/367; H04W 72/0446; H04L 27/368; H04L 25/03343; H04L 27/2614; H04L 27/38; H04L 27/2647; H04L 27/2626; H04L 27/367; H04L 25/49; G06F 17/11; G06F 17/17; G06F 30/20; G06F 17/12
    USPC ........................................................ 375/262
    See application file for complete search history.

(56) References Cited

U.S. PATENT DOCUMENTS

| | | | |
|---|---|---|---|
| 9,071,313 B2 | 6/2015 | Monsen | |
| 9,148,186 B1 | 9/2015 | Wu et al. | |
| 9,564,876 B2 | 2/2017 | Kim et al. | |
| 9,705,610 B2 | 7/2017 | Barzegar et al. | |
| 9,800,280 B2 | 11/2017 | Hedayati et al. | |
| 10,263,728 B1* | 4/2019 | Jeraj | H04B 1/0475 |
| 11,095,252 B1 | 8/2021 | Zhao et al. | |
| 2007/0165745 A1* | 7/2007 | Fonden | H04B 1/0475 375/297 |
| 2015/0318976 A1* | 11/2015 | Eltawil | H04B 1/44 370/278 |
| 2016/0182098 A1* | 6/2016 | Seebacher | H03F 3/24 375/296 |
| 2018/0159585 A1* | 6/2018 | Kanumalli | H04B 1/525 |

* cited by examiner

*Primary Examiner* — Eva Y Puente
(74) *Attorney, Agent, or Firm* — Law Office of Gerald Maliszewski; Gerald Maliszewski

(57) ABSTRACT

A system and method for digital receiver linearization is provided. An input digital signal is accepted with a plurality of spectral components. The input digital signal may be either a radio frequency (RF) digital signal or a baseband digital signal. Nonlinear distortion is created in response to the input digital signal. As the result of a corrected input digital signal, a primary baseband signal is created with real (I) and imaginary quadrature (Q) components. In response to the nonlinear distortion, auxiliary baseband signals are created with real ($I_{AUX}$) and imaginary quadrature ($Q_{AUX}$) components. The primary baseband signal is compared to the auxiliary baseband signals to supply complex amplitude correction coefficients. The complex amplitude correction coefficients are used to modify the nonlinear distortion, and the modified nonlinear distortion is subtracted from the input digital signal to supply the corrected input digital signal.

24 Claims, 5 Drawing Sheets

ADAPTIVE DIGITAL RECEIVER PATH LINEARIZER

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to digital receivers and, more particularly, to a digital receiver signal linearizer.

2. Description of the Related Art

Modern receivers for communications typically comprise analog front-end circuitry, and an analog-to-digital converter (ADC) followed by digital signal processing (DSP). In many applications the trend is towards increased digitalization to push functions such as down conversion and filtering, which have been conventionally implemented in the analog domain, to the DSP. This development simplifies the analog front-end circuitry providing many benefits including system cost, flexibility, and reliability. At the same time though, the requirements for the remaining analog blocks and the ADC become more demanding. The analog block and ADC must process a wider frequency band and operate over a wider dynamic range. Wider dynamic range comes from a requirement to receive a low level signal in the presence of a strong unwanted signal, or signals within the input frequency range of the receiver. Nonlinearities in the analog front-end or in the ADC produce harmonic distortion and intermodulation products that can occur at the same frequency as the desired signal, thus degrading the signal-to-noise ratio. However, improving the linearity of the analog blocks comes with the expense of higher cost and power consumption.

On the transmitter side, digital-predistortion (DPD) has become a common solution to mitigate the effects of non-linearity in the analog blocks, especially in the power amplifier. Similar techniques have not gained popularity in receivers. One reason being the lack of a good way to train the linearizer without injecting a known test signal into the receive chain, which is often impractical. Nonlinear effects are often dependent on external conditions such as temperature and supply voltage, can vary from part to part, and vary over the signal frequency.

It would be advantageous to have a receive path linearizer that can adapt to the presence of nonlinearity on its own, without needing to be trained with a test signal.

As noted above, nonlinear behavior in analog components is often frequency dependent. Even a frequency independent nonlinearity can turn into a frequency dependent one when the distorted signal subsequently passes through a frequency dependent channel before being digitized. Linearizing such a system cannot be achieved with a simple static inverse function. Solutions for wide-band linearizers exist, for example, ones based on Volterra series, but they tend to be very resource intensive. In many applications the desired signal consists of only one, or a small number of relatively narrow slices of the total digitized frequency spectrum.

It would be advantageous if a receiver system could be linearized over a wide band of frequency regions using a relatively simple structure.

SUMMARY OF THE INVENTION

The digital signal processing (DSP) section of the receiver linearizer described herein typically uses a digital down converter (DDC) that moves the frequency band of interest down to zero center frequency, applies digital filters to remove the signal content outside the band of interest, and reduces the sampling rate via a process called decimation. The output of the DDC, referred to as a baseband signal, is a complex signal consisting of the in-phase (I) and the quadrature component (Q).

The goal of the linearizer is to eliminate distortion products within the frequency range of interest. The overall concept is to detect the error caused by nonlinearities in the baseband, produce correction coefficients, and use them to create correction signal that is subtracted from the radio frequency (RF) input to the DDC. The system has two main operations: correction and the detection. While the correction has to work continuously when the desired signal is being received, the detection is only needed when the correction coefficients are being updated.

Accordingly, a method for digital receiver linearization is provided as follows. An input digital signal is accepted with a plurality of spectral components. When using the DDC, the input digital signal is in the radio frequency range. If the digital input signal is a baseband signal with in-band (I) and quadrature (Q), a down-sampler is needed (using only a lowpass and decimation filter). Nonlinear distortion is created in response to the input digital signal. As the result of a corrected input digital signal, a primary baseband signal is created with in-band or real (I) and imaginary quadrature (Q) components. In response to the nonlinear distortion, auxiliary baseband signals are created with real ($I_{AUX}$) and imaginary quadrature ($Q_{AUX}$) components. The primary baseband signal is compared to the auxiliary baseband signals to supply complex amplitude correction coefficients. The complex amplitude correction coefficients are used to modify the nonlinear distortion, and the modified nonlinear distortion is subtracted from the input digital signal to supply the corrected input digital signal.

Using the complex amplitude correction network to modify the nonlinear distortion includes substeps. The nonlinear distortion is multiplied by the complex amplitude correction coefficients to supply adjusted nonlinear distortion components that have been adjusted for amplitude and phase. Then, the adjusted nonlinear distortion components are combined to supply corrections. As a result, subtracting the modified nonlinear distortion from the input digital signal includes subtracting accepted corrections from the input digital signal to supply the corrected input digital signal.

In greater detail, creating nonlinear distortion includes creating real nonlinear distortion components ($I_{DIS}$) and imaginary quadrature nonlinear distortion components ($Q_{DIS}$). Further, multiplying the nonlinear distortion by the complex amplitude correction coefficients includes adjusting the amplitude of the real nonlinear distortion components ($I_{DIS}$) in response to the real (Icor) correction coefficients and adjusting the amplitude of the imaginary quadrature nonlinear distortion components ($Q_{DIS}$) in response to the imaginary (Qcor) correction coefficients. As a result, amplitude adjusted real nonlinear distortion components ($I_{ADJ}$) and amplitude adjusted imaginary quadrature nonlinear distortion components ($Q_{ADJ}$) are respectively supplied.

Combining the adjusted nonlinear distortion components includes combining the amplitude adjusted real nonlinear distortion components ($I_{ADJ}$) and separately combining the amplitude adjusted imaginary quadrature nonlinear distortion components ($I_{ADJ}$) to respectively supply combined amplitude adjusted real correction signal ($I_{COMB}$) and a combined amplitude adjusted imaginary quadrature correction signal ($Q_{COMB}$). Finally, the combined amplitude adjusted real correction signal ($I_{COMB}$) is subtracted from the input digital signal. In some aspects, the primary baseband signal is created at least partially in response to the combined amplitude adjusted imaginary quadrature correction signal ($Q_{COMB}$).

Additional details of the above-described methods, adaptive digital receiver linearizers, and a signal distorter system are provided below.

DETAILED DESCRIPTION

Figure 1:
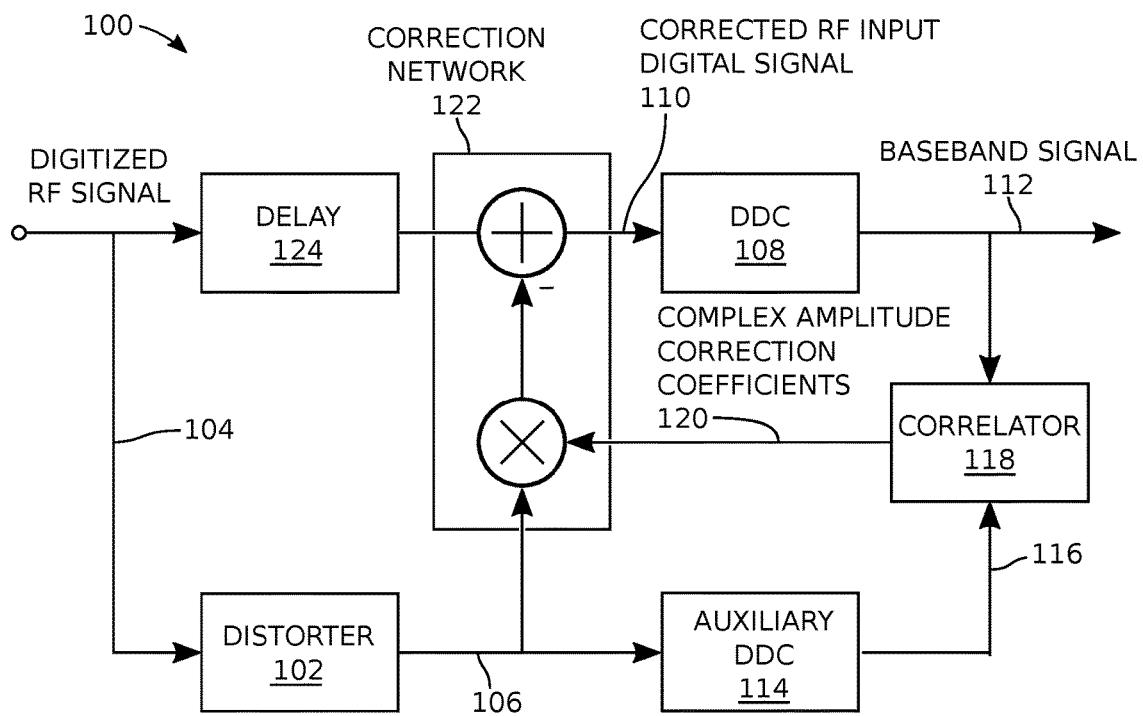
FIG. 1 is a schematic block diagram of an adaptive digital receiver linearizer.

FIG. 1 is a schematic block diagram of an adaptive digital receiver linearizer. The linearizer 100 comprises a distorter 102 having an input on line 104 to accept a radio frequency (RF) input digital signal with a plurality of spectral components and an output on line 106 to supply nonlinear distortion. A digital down converter (DDC) 108 has an input on line 110 to accept a corrected RF input digital signal and an output on line 112 to supply a primary baseband signal 112, with real (I) (112a, see FIG. 2) and imaginary quadrature (Q) (112b, see FIG. 2) components. An auxiliary DDC 114 has an input to accept the nonlinear distortion on line 106 and an output on line 116 to supply auxiliary baseband signals with real ($I_{AUX}$) components (116a, see FIG. 2) and imaginary quadrature ($Q_{AUX}$) components (116b, see FIG. 2). A correlator 118 has an input on line 112 to accept the primary baseband signal and an input on line 116 to accept the auxiliary baseband signals. The correlator 118 has an output on line 120 to supply complex amplitude correction coefficients, including real ($I_{COR}$) (120a, see FIG. 2) and imaginary quadrature ($Q_{COR}$) (120b, see FIG. 2) correction coefficients for the nonlinear distortion. A correction network 122 has an input on line 120 to accept the complex amplitude correction coefficients, an input to accept the nonlinear distortion on line 106, and an input to accept the input digital signal on line 104. In some aspects, as shown, a delay 124 is inserted into line 104 to compensate for any delay through the distorter 102. The correction network 122 has an output on line 110 to supply the corrected RF input digital signal.

Figure 2:
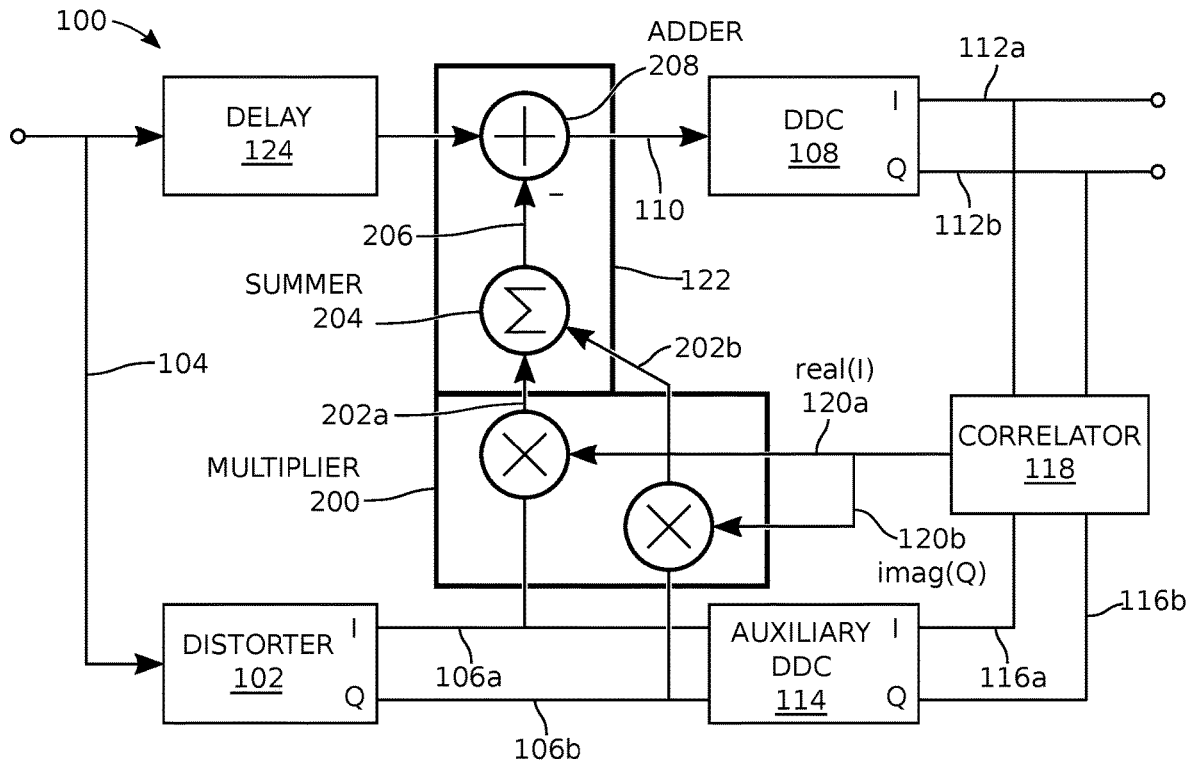
FIG. 2 is a schematic block diagram depicting the linearizer in greater detail.

FIG. 2 is a schematic block diagram depicting the linearizer in greater detail. The correction network comprises a multiplier 200 having an input to accept the complex amplitude correction coefficients on lines 120a and 120b, an input on lines 106a (I) and 106b (Q) to accept the nonlinear distortion, and an output on lines 202a (I) and 202b (Q) to supply adjusted nonlinear distortion components, in the time domain, that have been adjusted for amplitude and phase. A summer 204 has an input to accept the adjusted nonlinear distortion components 202a and 202b. The summer 204 combines the adjusted nonlinear distortion components to supply corrections at an output on line 206. An adder 208 has an input on line 104 to accept the RF input digital signal and input to accept corrections on line 206. The adder 208 subtracts the accepted corrections from the RF input digital signal to supply the corrected RF input digital signal at an output on line 110.

Figure 3:
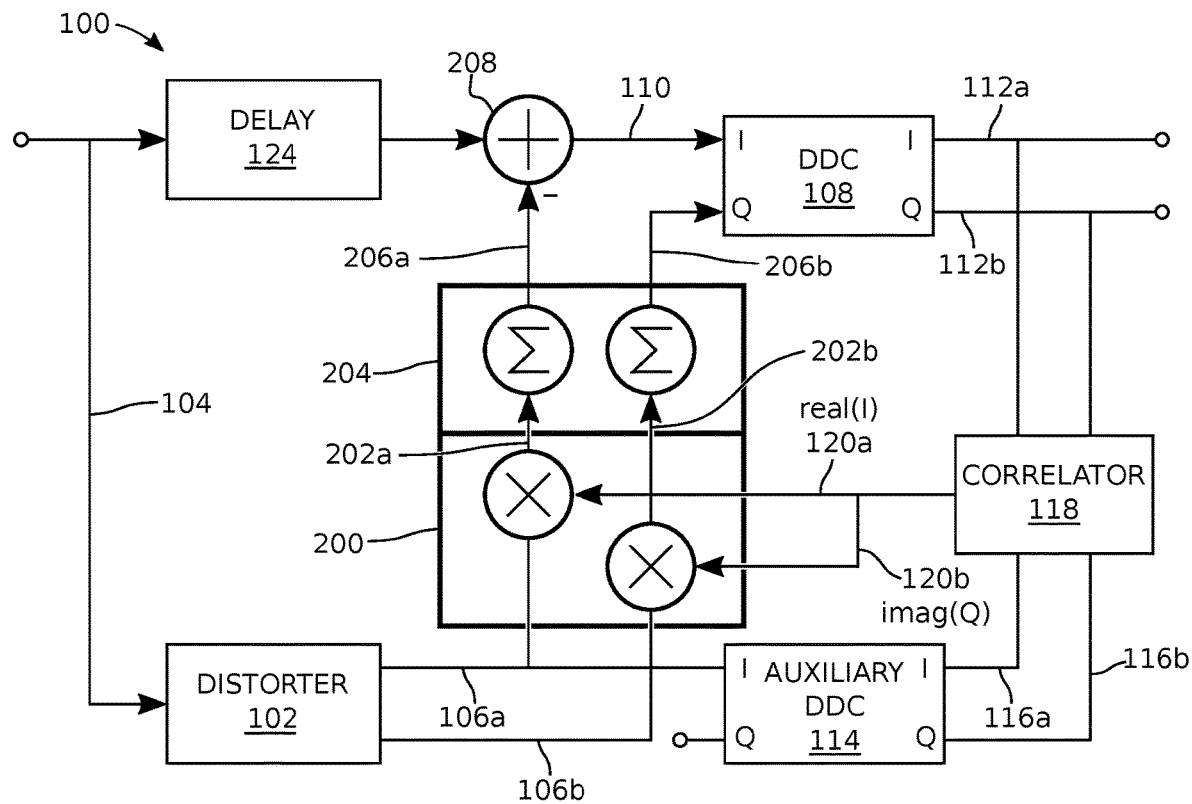
FIG. 3 is a schematic block diagram depicting a variation of the linearizer.

FIG. 3 is a schematic block diagram depicting a variation of the linearizer. The distorter 102 supplies real nonlinear distortion components ($I_{DIS}$) on line 106a and imaginary quadrature nonlinear distortion components ($Q_{DIS}$) on line 106b. Note that in this aspect the auxiliary DDC does not accept the imaginary quadrature nonlinear distortion components ($Q_{DIS}$) on line 106b. The multiplier 200 adjusts the amplitude of the real nonlinear distortion components ($I_{DIS}$) on line 106a in response to the real (Icor) correction coefficients on line 120a, and adjusts the amplitude of the imaginary quadrature nonlinear distortion components ($Q_{DIS}$) 106b in response to the imaginary (Qcor) correction coefficients on line 120b. Respectively supplied are amplitude adjusted real nonlinear distortion components ($I_{ADJ}$) on line 202a and amplitude adjusted imaginary quadrature nonlinear distortion components ($Q_{ADJ}$) on line 202b. The summer 204 combines the amplitude adjusted real nonlinear distortion components ($I_{ADJ}$) and combines the amplitude adjusted imaginary quadrature nonlinear distortion components ($I_{ADJ}$) to respectively supply combined amplitude adjusted real correction signal ($I_{COMB}$) on line 206a and a combined amplitude adjusted imaginary quadrature correction signal ($Q_{COMB}$) on line 206b. The adder 208 subtracts the combined amplitude adjusted real correction signal ($I_{COMB}$) on line 206a from the RF input digital signal on line 104 to supply the corrected RF input digital signal on line 110. In one aspect, as shown, the combined amplitude adjusted imaginary quadrature correction signal ($Q_{COMB}$) on line 206b is supplied to an input of the DDC 108.

In one aspect, the auxiliary DDC 114 sequentially supplies N auxiliary baseband signals, ($I_{AUX1}$ through $I_{AUXN}$) on line 116a and ($Q_{AUX1}$ through $Q_{AUXN}$) on line 116b, corresponding to N nonlinear distortion components, where N is an integer greater than 1. The correlator 118 then sequentially supplies N complex amplitude correction coefficients on lines 120a and 120b. The summer 204 combines N amplitude adjusted real nonlinear distortion components on lines 202a and combines the N amplitude adjusted imaginary quadrature nonlinear distortion components on line 202b to supply the combined amplitude adjusted real correction signal ($I_{COMB}$) on line 206a and the combined amplitude adjusted imaginary quadrature correction signal ($Q_{COMB}$) on line 206b.

Figure 4:
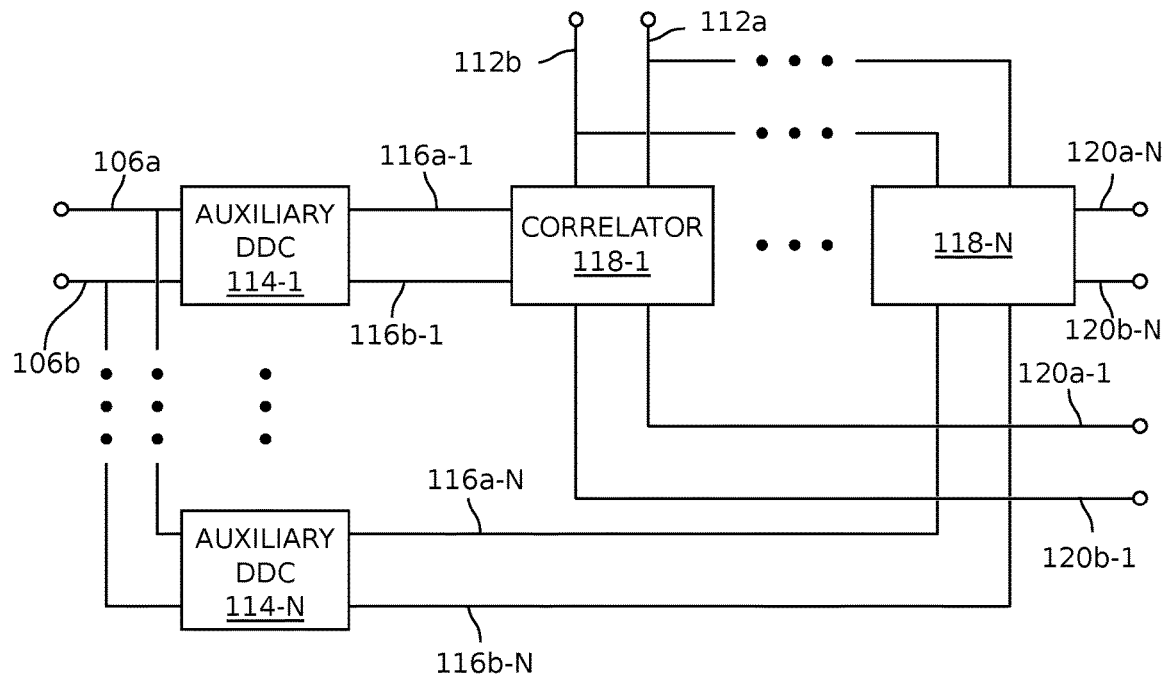
FIG. 4 is a schematic block diagram depicting details of an exemplary auxiliary DDC and correlator.

FIG. 4 is a schematic block diagram depicting details of an exemplary auxiliary DDC and correlator. In this case, the auxiliary DDC comprises N parallel-connected auxiliary DDCs 114-1 through 114-N to supply N corresponding nonlinear distortion components, ($I_{AUX1}$ through $I_{AUXN}$) on lines 116a-1 through 116a-N and ($Q_{AUX1}$ through $Q_{AUXN}$) on lines 116b-1 through 116b-N, where N is an integer greater than 1. Likewise, there are N parallel-connected correlators 118-1 through 118-N to supply N complex amplitude correction coefficients 120a-1 through 120a-N and 120b-1 through 120b-N.

Returning to FIGS. 1-3, the distorter 102 typically supplies second-order nonlinear distortion signals and third-order nonlinear distortion signals derived from the input digital signal. More generally however, the distorter can be constructed to supply any order of nonlinear distortion signals (i.e., nth-order nonlinear distortion signals, where n is an integer greater than 1), from the input digital signal.

Figure 5A:
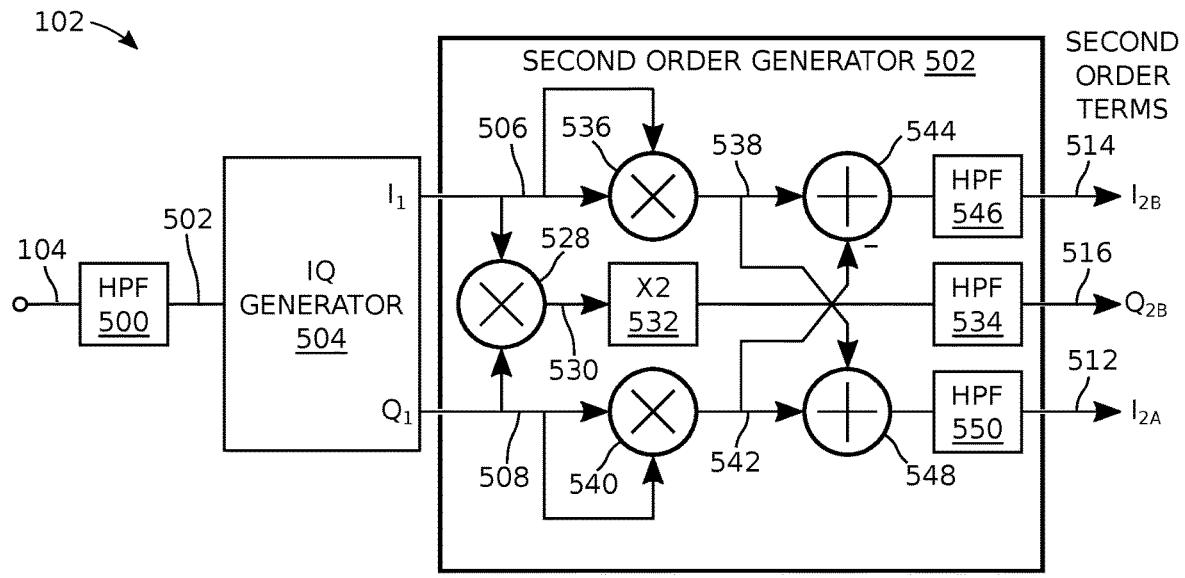
FIGS. 5A and 5B are a schematic block diagrams depicting details of an exemplary distorter.
Figure 5B:
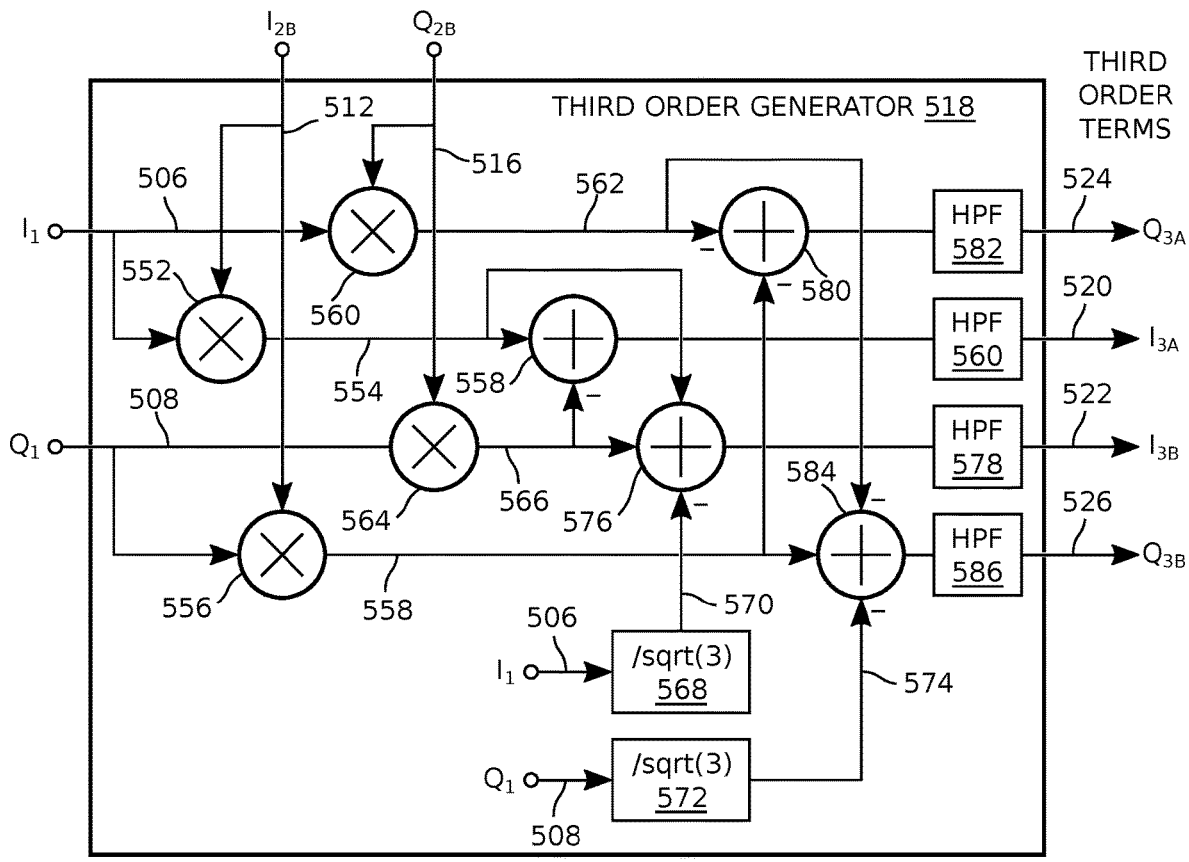

FIGS. 5A and 5B are schematic block diagrams depicting details of an exemplary distorter. In this example, the distorter 102 is constructed to supply second and third-order nonlinearities. The distorter 102 accepts the RF input digital signal on line 104 (FIG. 5A). In some aspects, the input signal is passed through a highpass filter 500 to supply a distorter input signal on line 502, connected to the input of an IQ generator 504. The IQ generator 504 has an output on line 506 to supply a first-order real signal ($I_1$) and an output on line 508 to supply a first-order imaginary quadrature signal ($Q_1$). A second-order generator 510 has an input on lines 506 and 508 to respectively accept $I_1$ and $Q_1$, and outputs on lines 512 and 514 to respectively supply real second order products $I_{2A}$ and $I_{2B}$. The second-order generator 510 also has an output on line 516 to supply an imaginary quadrature second order product $Q_{2B}$, where "A" and "B" represent, respectively, lower and upper sidebands of a signal in the frequency domain.

In FIG. 5B a third-order generator 518 has inputs to accept $I_1$ on line 506, $Q_1$ on line 508, $I_{2B}$ on line 512, and $Q_{2B}$ on line 516. The third-order generator 518 has outputs to supply real third-order products $I_{3A}$ on line 520 and $I_{3B}$ on line 522, and imaginary third-order quadrature products $Q_{3A}$ on line 524 and $Q_{3B}$ on line 526.

The second-order generator 510 comprises a first mixer 528 having inputs to accept $I_1$ and $Q_1$ on respective lines 506 and 508, and an output on line 530 to supply a first product. A $2x$ gain block 532 has an input to accept the first product on line 530 and an output on line 516 to supply a second-order imaginary quadrature component $Q_{2B}$. In some aspects (as shown), a highpass filter 534 may be incorporated into line 516. A second mixer 536 has inputs on line 506 to accept $I_1$ and an output on line 538 to supply a second product (($I_1)^2$). A third mixer 540 has inputs on line 508 to accept $Q_1$ and an output on line 542 to supply a third product (($Q_1)^2$). A first adder 544 has inputs respectively on lines 542 and 538 to subtract the third product from the second product, and an output on line 514 to supply $I_{2B}$. In one aspect (as shown) a highpass filter 546 is incorporated into line 514. A second adder 548 has inputs respectively on lines 538 and 542 to accept the second and third products and an output to supply $I_{2A}$ on line 512. In one aspect (as shown) a highpass filter 550 is incorporated into line 512.

The third-order generator 518 comprises a fourth mixer 552 having inputs respectively on lines 506 and 512 to accept $I_1$ and $I_{2B}$, and an output on line 554 to supply a fourth product. A fifth mixer 556 has inputs on lines 508 and 512 to respectively accept $Q_1$ and $I_{2B}$, and an output to supply a fifth product on line 558. A sixth mixer 560 has inputs respectively on lines 506 and 516 to accept $I_1$ and $Q_{2B}$, and an output on line 562 to supply a sixth product. A seventh mixer 564 has inputs respectively on line 508 and 516 to accept $Q_1$ and $Q_{2B}$, and an output to supply a seventh product on line 566. A third adder has inputs respectively on lines 566 and 554 to subtract the seventh product from the fourth product, and an output on line 520 to supply $I_{3A}$. In one aspect (as shown) a highpass filter 560 is incorporated into line 520.

A first calculator 568 has an input on line 506 to accept $I_1$, to multiply $I_1$ by a constant $1/\text{sqrt}(3)$, and to supply an eighth product at an output on line 570. A second calculator 572 has an input on line 508 to accept $Q_1$, to multiply $Q_1$ by the constant $1/\text{sqrt}(3)$, and supply a ninth product at an output on line 574. A fourth adder 576 has inputs to subtract the eighth product (line 570) from the seventh product (line 566) and the fourth product (line 554), and an output to supply $I_{3B}$ on line 522. In one aspect (as shown) a highpass filter 578 is incorporated into line 522. A fifth adder 580 has inputs to accept a negative sixth product from line 562 and a negative fifth product from line 558, and an output to supply $Q_{3A}$ on line 524. In one aspect (as shown) a highpass filter 582 is incorporated into line 524. A sixth adder 584 has inputs to add the fifth product (line 558), a negative sixth product (line 562), and a negative ninth product (line 574), and an output to supply $Q_{3B}$ on line 526. In one aspect (as shown) a highpass filter is 586 incorporated into line 526.

Figure 6:
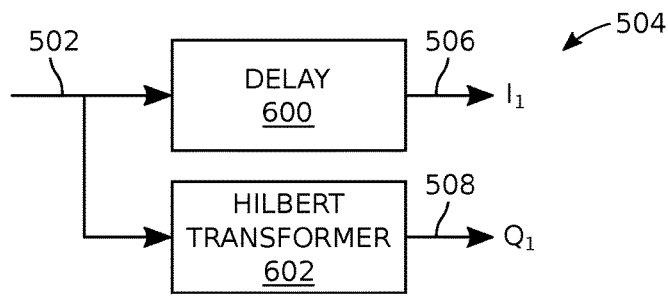
FIG. 6 is a schematic block diagram depicting the IQ generator in greater detail.

FIG. 6 is a schematic block diagram depicting the IQ generator in greater detail. A delay unit 600 accepts the distorter input digital signal on 502 and has an output to supply $I_1$ on line 506. A Hilbert transformer 602 has an input to accept the distorter input digital signal on line 502 and an output on line 508 to supply $Q_1$. The length of the delay through delay unit 600 is calculated to be equal to the time it takes to perform a Hilbert transformation.

Figure 7:
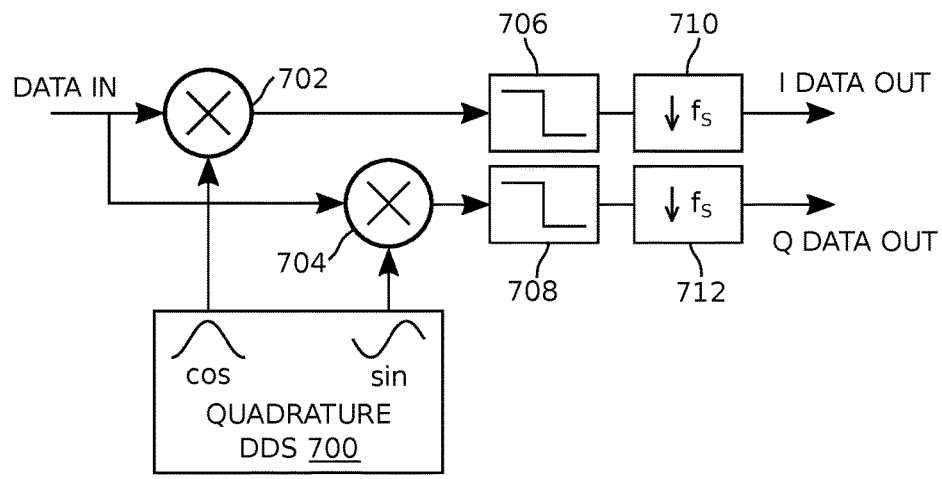
FIG. 7 is a schematic block diagram of an exemplary DDC (prior art).

FIG. 7 is a schematic block diagram of an exemplary DDC (prior art). The DDC comprises a direct digital synthesizer (DDS) 700, mixers 702 and 704, lowpass filters 706 and 708, and decimation filters 710 and 712 that downsample the signal at a low frequency.

Figure 8:
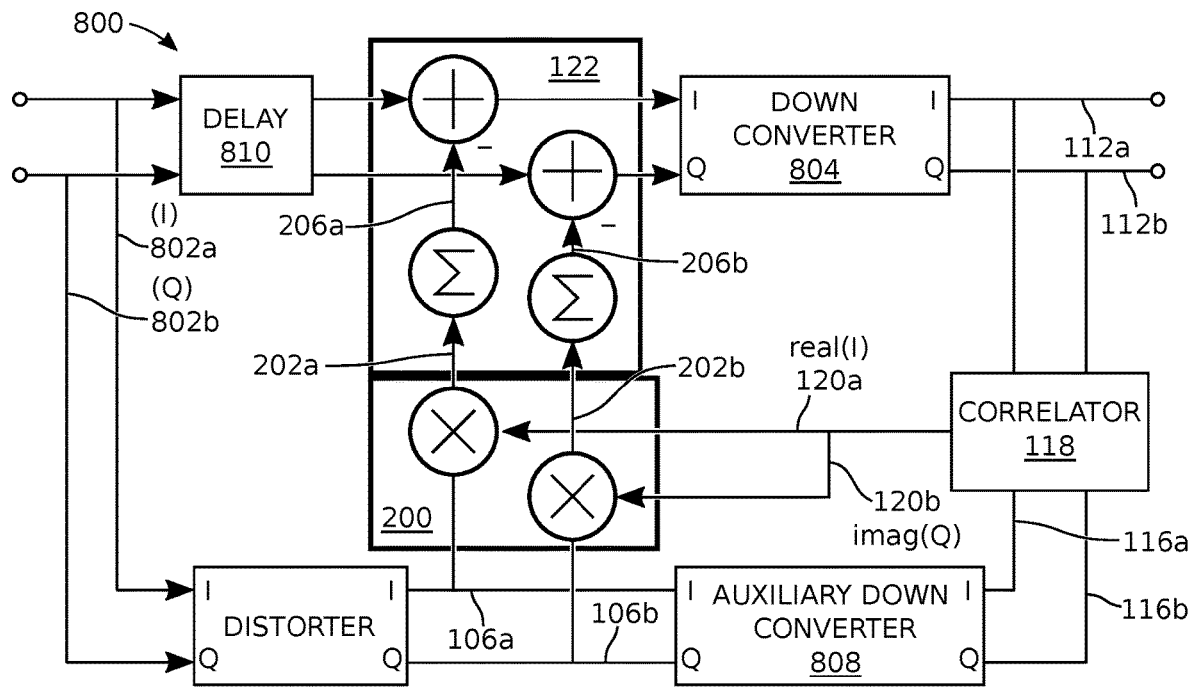
FIG. 8 is a schematic block diagram depicting an adaptive digital baseband receiver linearizer.

FIG. 8 is a schematic block diagram depicting an adaptive digital baseband receiver linearizer. In general, the baseband linearizer 800 is the same as the linearizer described above, except that the DDCs are replaced with down-samplers. Referring briefly to FIG. 7, a down-sampler is similar to a DDC, but does not include a DDS or mixers. The distorter 102 has an input to accept a baseband input digital signal on lines 802a and 802b with, respectively, real and imaginary components, and with a plurality of spectral components, and has an output on lines 106a and 106b to supply nonlinear distortion. As noted above, the down-sampler 804 comprises a lowpass frequency filter and a decimation filter, with an input to accept a corrected baseband input digital signal 806 and an output to supply a primary baseband signal with real (I) on line 112a and imaginary quadrature (Q) components on line 112b.

An auxiliary down-sampler 808 has an input to accept the nonlinear distortion on lines 106a and 106b. The auxiliary down-sampler 808 has an output to supply auxiliary baseband signals with real components ($I_{AUX}$) on line 116a and imaginary quadrature components ($Q_{AUX}$) on line 116b. A correlator 118 has an input to accept the primary baseband signal on lines 112a and 112b and the auxiliary baseband signals on line 116a and 116b, and an output to supply complex amplitude correction coefficients, including real ($I_{COR}$) and imaginary quadrature ($Q_{COR}$) correction coefficients, respectively on lines 120a and 120b, for the nonlinear distortion. A correction network 122 has an input to accept the complex amplitude correction coefficients on lines 120a and 120b, an input to accept the nonlinear distortion on lines 106a and 106b, and an input to accept the baseband input digital signal on line 802. In some aspects, as shown, a delay 810 is inserted into line 802 to compensate for any delay through the distorter 102. The correction network 122 has an output to supply the corrected baseband input digital signal on line 806.

As described in detail above in the explanation of FIGS. 2 through 4, the correction network 122 comprises a multiplier 200, a summer 204, and an adder 208. Details of these components are not repeated here in the interest of brevity. The summer 204 supplies the combined amplitude adjusted real correction signal ($I_{COMB}$) on line 206a and the imaginary quadrature correction signal ($Q_{COMB}$) on line 206b. Likewise, the details of the distorter as shown in FIGS. 5 and 6 are also applicable to the baseband linearizer of FIG. 8.

The nature of the nonlinearity issue can be examined by looking at the third-order nonlinearity as an example. When a signal consisting of two sinusoids at frequencies f1 and f2 is passed through a system with third order nonlinearity it produces two groups additional sinusoids, the first group having the frequencies 3*f1, 3*f2, 2*f1+f2, and f1+2*f2, and the second group having frequencies 2*f1−f2, 2*f1, f1, and f2. If the frequencies f1 and f2 are close to one another, the first group of new frequencies is centered around three times the original frequencies, while the second group stays around the original frequencies. When this signal is digitized, the aliasing effect caused by the sampling operation can translate the first group of the sinusoids back to lower frequencies. With some frequency combinations it is possible that one or more aliased tones from the first group can end up within close proximity to the tones of the second group. If this is the region of the spectrum to be linearized, it is obvious that using a single or a single set of correction parameters for the third-order linearity is not likely to be very effective because of the 3× frequency difference between the two groups of tones. One aspect of the linearization system is to separate the distortion product produced by the third-order nonlinearity into two sidebands and use separate correction parameters for each band. In the case of the third-order nonlinearity the lower sideband consists of the second group of tones and the upper sideband of the first group of tones. The same concept applies to other orders of nonlinearity as well. Higher orders of nonlinearity can have more than two bands. While this example uses a signal consisting of sinusoids, the concept is valid for any type of signals.

The operation of any linearizer that post-corrects a distorted signal can be described as having a block with a nonlinearity that is the inverse of the nonlinearity being corrected, and passing the distorted signal through it. The resulting output signal is free of distortion. Alternatively, as described herein, a block can be used that creates a correction signal that matches the error caused by the nonlinearity, and subtracts it from the signal being corrected.

The DSP section of the receiver typically has a DDC that moves the frequency band of interest down to zero center frequency, applies digital filters to remove the signal content outside the band of interest, and reduces the sampling rate via process called decimation. The output of the DDC, referred to as the baseband signal, is a complex signal consisting of the in-phase (I) and the quadrature component (Q).

The goal of the linearizer is to eliminate distortion products within the frequency range of interest. The overall concept is to detect the error caused by nonlinearity in the baseband, produce correction coefficients, and use them to create a correction signal that is subtracted from the RF input to the DDC. The system has two main operations: the correction and the detection. While the correction has to work continuously when the desired signal is being received, the detection is only needed when the correction coefficients are being updated.

These two functions share a common block called a distorter. The distorter input is the digitized RF signal and its output signal consists of plurality of components representing the sidebands of the orders of nonlinearity being corrected. The correction signal is formed by multiplying these components by the correction coefficients produced by the detector, and adding them together.

The correction coefficient for a single sideband is a complex number that is capable of representing both the phase and the magnitude of the correction needed. As the digitized RF signal is typically a real signal, implementing the complex correction can be accomplished in multiple ways. One alternative is to have the distorter produce an IQ signal for each side band, apply the real part of the correction coefficient to the I signal and the imaginary part to the Q signal, and add the two together yielding a real signal that is subtracted from the digitized RF signal. Another way is use a DDC that has both I and Q inputs and have a distorter to produce a real output (FIG. 3). The real parts of the correction coefficients are applied to distorter output to produce the real part of the correction signal that is added to the digitized RF signal and sent to the I input of the DDC. The imaginary parts of the correction coefficients can be applied to the distorted signal to produce the imaginary part of the correction signal which is sent to the Q input of the DDC.

The error detection is based on the assumption that the desired output signal is free of distortion components. To achieve that goal a correlator is used in a negative feedback loop to drive the distortion products to zero. One input to the correlator is the baseband signal and the other is the multi-component output of the distorter. Prior to the correlator, the distorter output is passed through an auxiliary DDC to bring the distortion to baseband. The correlator outputs are the correction coefficients. The correlator and the auxiliary DDC may be composed of multiple units, one for each distortion component. Since these multiple units do not need to operate simultaneously, they may be implemented by time sharing a single physical block.

The distorter uses a cascade of digital mixers and sideband selectors to produce the multi-sideband outputs for each order of nonlinearity (FIG. 5). The mixers require a complex input signal. Since the digitized RF signal is typically a real signal, a quadrature generator is needed prior to the first mixer in the chain. It can be enabled as a Hilbert transformer and a matching delay in the I path (FIG. 6).

The distorter shown in FIGS. 5A and 5B produces second and third-order distortion components. The incoming digitized RF signal is passed through quadrature generator to obtain its IQ representation. This IQ signal is mixed with itself using a mixer consisting of three multipliers and a gain of two block. Two adders are used to create the signals representing the upper and lower side bands. This structure yields IQ signals for the upper sideband, but only the I component for the lower sideband. If needed, a separate quadrature generator can be used to generate the Q signal. When using the linearizer variation of FIG. 3 for example, the Q component is not needed.

The third-order distortion products are obtained by mixing the IQ input signal with the upper sideband of the second order term. This mixer consists of four digital multipliers.

Four adders are used to produce the IQ signals for two sidebands. The quadrature (Q) components may not be needed depending on the linearizer implementation and whether higher order distortion components are being generated. When generated as described above, the lower sideband of the third-order nonlinearity includes a scaled copy of the original input signal. It's presence in error detection creates a strong unwanted correlation. To remove the unwanted correlation, the input signal is weighted with a constant (/(sqrt(3)) and subtracted from the lower sideband signal to eliminate the unwanted components in the original the input frequency (f1 and f2 in the third-order two tone example). High pass filters (HPFs) are used in various locations to remove the DC components from the signals to avoid producing unwanted mixing products. Not all the filters are strictly needed as some DC components that arise from finite accuracy of the digital implementation may not be present at significant magnitude levels.

While not shown in FIGS. 5A and 5B, generating higher order distortion products is straight forward. The fourth-order components can be obtained either by mixing the second-order terms with themselves or mixing the third-order terms with the IQ input signal. Similarly, multiple bands of fifth-order terms can be produced by mixing second-order terms with the third-order terms.

In one variation (FIG. 8) the input to the linearizer is already in the baseband. in the form of IQ signal. In that case the DSP section only performs lowpass filtering and decimation without mixing. This can be viewed as having a DDC which is programmed to zero center frequency.

The linearizer described here falls under the category of digital signal processing (DSP). Such a system can be enabled as a digital logic circuit built as an integrated circuit (IC) or as field programmable gate array (FPGA), software running on a programmable DPS engine or on general purpose processor, or as a combination of these components.

Figure 9:
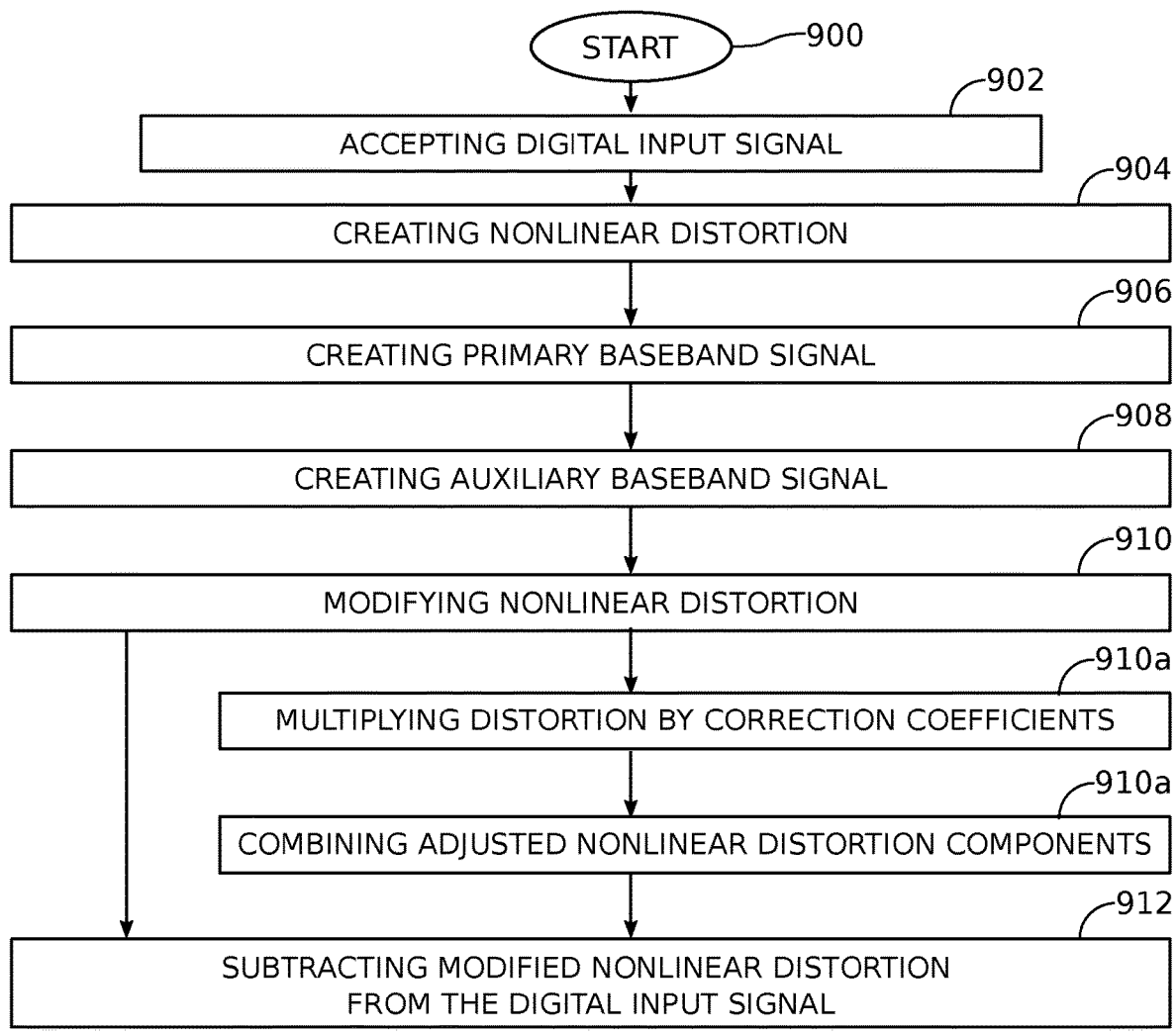
FIG. 9 is a flowchart illustrating a method for digital receiver linearization.

FIG. 9 is a flowchart illustrating a method for digital receiver linearization. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 900.

Step 902 accepts an input digital signal with a plurality of spectral components. The input digital signal may be either a radio frequency (RF) digital signal (when using a DDC) or a baseband digital signal with real and imaginary quadrature components (when using a down-sampler). Step 904 creates nonlinear distortion in response to the input digital signal. In response to a corrected input digital signal, Step 906 creates a primary baseband signal with real (I) and imaginary quadrature (Q) components. In response to the nonlinear distortion, Step 908 creates auxiliary baseband signals with real ($I_{AUX}$) and imaginary quadrature ($Q_{AUX}$) components. In response to comparing the primary baseband signal to the auxiliary baseband signals, Step 910 uses the complex amplitude correction coefficients to modify the nonlinear distortion. Step 912 subtracts the modified nonlinear distortion from the input digital signal to supply the corrected input digital signal.

In one aspect, using the complex amplitude correction network to modify the nonlinear distortion in Step 910 includes the following substeps. Step 910a multiplies the nonlinear distortion by the complex amplitude correction coefficients to supply adjusted nonlinear distortion components that have been adjusted for amplitude and phase. Step 910b combines the adjusted nonlinear distortion components to supply corrections at an output. Then, subtracting the modified nonlinear distortion from the input digital signal in Step 912 includes subtracting accepted corrections from the input digital signal to supply the corrected input digital signal.

In another aspect, creating nonlinear distortion in Step 904 includes creating real nonlinear distortion components ($I_{DIS}$) and imaginary quadrature nonlinear distortion components ($Q_{DIS}$). Then Step 910a adjusts the amplitude of the real nonlinear distortion components ($I_{DIS}$) in response to the real (Icor) correction coefficients, and adjusts the amplitude of the imaginary quadrature nonlinear distortion components ($Q_{DIS}$) in response to the imaginary (Qcor) correction coefficients, to respectively supply amplitude adjusted real nonlinear distortion components ($I_{ADJ}$) and amplitude adjusted imaginary quadrature nonlinear distortion components ($Q_{ADJ}$). Step 910b combines the amplitude adjusted real nonlinear distortion components ($I_{ADJ}$), and combines the amplitude adjusted imaginary quadrature nonlinear distortion components ($I_{ADJ}$) to respectively supply combined amplitude adjusted real correction signal ($I_{COMB}$) and a combined amplitude adjusted imaginary quadrature correction signal ($Q_{COMB}$). Step 912 then subtracts the combined amplitude adjusted real correction signal ($I_{COMB}$) from the input digital signal. In one aspect however, Step 906 creates the primary baseband signal at least partially in response to the combined amplitude adjusted imaginary quadrature correction signal ($Q_{COMB}$).

Systems and methods have been provided for digital receiver linearization. Examples of particular combinational logic, delay, routing, and decision structures have been presented to illustrate the invention. However, the invention is not limited to merely these examples. Other variations and embodiments of the invention will occur to those skilled in the art.

I claim:

1. An adaptive digital receiver linearizer comprising:
   a distorter having an input to accept a radio frequency (RF) input digital signal with a plurality of spectral components and an output to supply nonlinear distortion;
   a digital down converter (DDC) having an input to accept a corrected RF input digital signal and an output to supply a primary baseband signal with real (I) and imaginary quadrature (Q) components;
   an auxiliary DDC having an input to accept the nonlinear distortion and an output to supply auxiliary baseband signals with real ($I_{AUX}$) and imaginary quadrature ($Q_{AUX}$) components;
   a correlator having an input to accept the primary baseband signal and the auxiliary baseband signals, and an output to supply complex amplitude correction coefficients, including real ($I_{COR}$) and imaginary quadrature ($Q_{COR}$) correction coefficients for the nonlinear distortion; and,
   a correction network having an input to accept the complex amplitude correction coefficients, an input to accept the nonlinear distortion, an input to accept the input digital signal, and an output to supply the corrected RF input digital signal.

2. The linearizer of claim 1 wherein the correction network comprises:
   a multiplier having an input to accept the complex amplitude correction coefficients, an input to accept the nonlinear distortion, and an output to supply adjusted nonlinear distortion components that have been adjusted for amplitude and phase;

a summer having an input to accept the adjusted nonlinear distortion components, the summer combining the adjusted nonlinear distortion components to supply corrections at an output; and, an adder having an input to accept the RF input digital signal and input to accept corrections, the adder subtracting the accepted corrections from the RF input digital signal to supply the corrected RF input digital signal at an output.

3. The system of claim 2 wherein the distorter supplies real nonlinear distortion components ($I_{DIS}$) and imaginary quadrature nonlinear distortion components ($Q_{DIS}$);

wherein the multiplier adjusts the amplitude of the real nonlinear distortion components ($I_{DIS}$) in response to the real (Icor) correction coefficients and adjusts the amplitude of the imaginary quadrature nonlinear distortion components ($Q_{DIS}$) in response to the imaginary (Qcor) correction coefficients, to respectively supply amplitude adjusted real nonlinear distortion components ($I_{ADJ}$) and amplitude adjusted imaginary quadrature nonlinear distortion components ($Q_{ADJ}$);

wherein the summer combines the amplitude adjusted real nonlinear distortion components ($I_{ADJ}$) and combines the amplitude adjusted imaginary quadrature nonlinear distortion components ($I_{ADJ}$) to respectively supply combined amplitude adjusted real correction signal ($I_{COMB}$) and a combined amplitude adjusted imaginary quadrature correction signal ($Q_{COMB}$); and, wherein the adder subtracts the combined amplitude adjusted real correction signal ($I_{COMB}$) from the RF input digital signal.

4. The system of claim 3 wherein the combined amplitude adjusted imaginary quadrature correction signal ($Q_{COMB}$) is supplied to an input of the DDC.

5. The system of claim 3 wherein the auxiliary DDC sequentially supplies N auxiliary baseband signals, ($I_{AUX1}$ through $I_{AUXN}$) and ($Q_{AUX1}$ through $Q_{AUXN}$), corresponding to N nonlinear distortion components, where N is an integer greater than 1;

wherein the correlator sequentially supplies N complex amplitude correction coefficients;

wherein the summer combines N amplitude adjusted real nonlinear distortion components and combines the N amplitude adjusted imaginary quadrature nonlinear distortion components to supply the combined amplitude adjusted real correction signal ($I_{COMB}$) and the combined amplitude adjusted imaginary quadrature correction signal ($Q_{COMB}$).

6. The system of claim 3 wherein the auxiliary DDC comprises N parallel-connected auxiliary DDCs to supply N corresponding nonlinear distortion components, ($I_{AUX1}$ through $I_{AUXN}$) and ($Q_{AUX1}$ through $Q_{AUXN}$), where N is an integer greater than 1; and, wherein the correlator comprises N parallel-connected correlators to supply N complex amplitude correction coefficients.

7. The system of claim 3 wherein the distorter, for each component in the input digital signal, supplies second-order nonlinear distortion signals and third-order nonlinear distortion signals.

8. The system of claim 3 wherein the distorter, for each component in the input digital signal, supplies nth-order nonlinear distortion signals, where n is an integer greater than 1.

9. The system of claim 3 wherein the distorter comprises:

an IQ generator having an input to accept a distorter input digital signal, and an output to supply a first-order real signal ($I_1$) and a first-order imaginary quadrature signal ($Q_1$);

a second-order generator having an input to accept $I_1$ and $Q_1$ and an output to supply real second order products $I_{2A}$ and $I_{2B}$, and an imaginary quadrature second order product $Q_{2B}$, where "A" and "B" represent, respectively, lower and upper sidebands of a signal in the frequency domain; and, a third-order generator having an input to accept $I_1$, $Q_1$, $I_{2B}$, and $Q_{2B}$, and an output to supply real third-order products $I_{3A}$ and $I_{3B}$, and imaginary third-order quadrature products $Q_{3A}$ and $Q_{3B}$.

10. The system of claim 9 wherein the second-order generator comprises:

a first mixer having inputs to accept $I_1$ and $Q_1$, and an output to supply a first product;

a 2× gain block having an input to accept the first product and an output to supply a second-order imaginary quadrature component $Q_{2B}$;

a second mixer having inputs to accept $I_1$ and an output to supply a second product ($(I_1)^2$);

a third mixer having inputs to accept $Q_1$ and an output to supply a third product ($(Q_1)^2$);

a first adder having inputs to subtract the third product from the second product, and an output to supply $I_{2B}$; and, a second adder having inputs to accept the second and third products and an output to supply $I_{2A}$.

11. The system of claim 9 wherein the third-order generator comprises:

a fourth mixer having inputs to accept $I_1$ and $I_{2B}$, and an output to supply a fourth product;

a fifth mixer having inputs to accept $Q_1$ and $I_{2B}$, and an output to supply a fifth product;

a sixth mixer having inputs to accept $I_1$ and $Q_{2B}$, and an output to supply a sixth product;

a seventh mixer having inputs to accept $Q_1$ and $Q_{2B}$, and an output to supply a seventh product;

a third adder having inputs to subtract the seventh product from the fourth product, and an output to supply $I_{3A}$;

a first calculator having an input to accept $I_1$, and multiplying $I_1$ by a constant 1/sqrt(3) to supply an eighth product at an output;

a second calculator having an input to accept $Q_1$, and multiplying $Q_1$ by the constant 1/sqrt(3) to supply a ninth product at an output;

a fourth adder having inputs to subtract the eighth product from the seventh product and the fourth product, and an output to supply $I_{3B}$;

a fifth adder having inputs to accept a negative sixth product and a negative fifth product, and an output to supply $Q_{3A}$; and, a sixth adder having inputs to add the fifth product, a negative sixth product, and a negative ninth product, and an output to supply $Q_{3B}$.

12. The system of claim 9 wherein the IQ generator comprises:

a delay unit to accept the distorter input digital signal and an output to supply $I_1$; and, a Hilbert transformer having an input to accept the distorter input digital signal and an output to supply $Q_1$.

13. An adaptive digital baseband receiver linearizer comprising:
   distorter having an input to accept a baseband input digital signal with real and imaginary components, and with a plurality of spectral components, and an output to supply nonlinear distortion;
   a down-sampler comprising a lowpass frequency filter and a decimation filter, having an input to accept a corrected baseband input digital signal and an output to supply a primary baseband signal with real (I) and imaginary quadrature (Q) components;
   an auxiliary down-sampler having an input to accept the nonlinear distortion and an output to supply auxiliary baseband signals with real ($I_{AUX}$) and imaginary quadrature ($Q_{AUX}$) components;
   a correlator having an input to accept the primary baseband signal and the auxiliary baseband signals, and an output to supply complex amplitude correction coefficients, including real ($I_{COR}$) and imaginary quadrature ($Q_{COR}$) correction coefficients for the nonlinear distortion; and,
   a correction network having an input to accept the complex amplitude correction coefficients, an input to accept the nonlinear distortion, an input to accept the baseband input digital signal, and an output to supply the corrected baseband input digital signal.

14. The linearizer of claim 13 wherein the correction network comprises:
   a multiplier having an input to accept the complex amplitude correction coefficients, an input to accept the nonlinear distortion, and an output to supply adjusted nonlinear distortion components that have been adjusted for amplitude and phase;
   a summer having an input to accept the adjusted nonlinear distortion components, the summer combining the adjusted nonlinear distortion components to supply corrections at an output; and,
   an adder having an input to accept the baseband input digital signal and input to accept corrections, the adder subtracting the accepted corrections from the baseband input digital signal to supply the corrected baseband input digital signal at an output.

15. The system of claim 14 wherein the distorter supplies real nonlinear distortion components ($I_{DIS}$) and imaginary quadrature nonlinear distortion components ($Q_{DIS}$);
   wherein the multiplier adjusts the amplitude of the real nonlinear distortion components ($I_{DIS}$) in response to the real (Icor) correction coefficients and adjusts the amplitude of the imaginary quadrature nonlinear distortion components ($Q_{DIS}$) in response to the imaginary (Qcor) correction coefficients, to respectively supply amplitude adjusted real nonlinear distortion components ($I_{ADJ}$) and amplitude adjusted imaginary quadrature nonlinear distortion components ($Q_{ADJ}$);
   wherein the summer combines the amplitude adjusted real nonlinear distortion components ($I_{ADJ}$) and combines the amplitude adjusted imaginary quadrature nonlinear distortion components ($I_{ADJ}$) to respectively supply combined amplitude adjusted real correction signal ($I_{COMB}$) and a combined amplitude adjusted imaginary quadrature correction signal ($Q_{COMB}$); and,
   wherein the adder subtracts the combined amplitude adjusted real correction signal ($I_{COMB}$) and the combined amplitude adjusted imaginary quadrature correction signal ($Q_{COMB}$) from the baseband input digital signal.

16. A method for digital receiver linearization, the method comprising:
   accepting an input digital signal with a plurality of spectral components;
   creating nonlinear distortion in response to the input digital signal;
   in response to a corrected input digital signal, creating a primary baseband signal with real (I) and imaginary quadrature (Q) components;
   in response to the nonlinear distortion, creating auxiliary baseband signals with real ($I_{AUX}$) and imaginary quadrature ($Q_{AUX}$) components;
   in response to comparing the primary baseband signal to the auxiliary baseband signals, supplying complex amplitude correction coefficients;
   using the complex amplitude correction coefficients to modify the nonlinear distortion; and,
   subtracting the modified nonlinear distortion from the input digital signal to supply the corrected input digital signal.

17. The method of claim 16 wherein using the complex amplitude correction network to modify the nonlinear distortion includes:
   multiplying the nonlinear distortion by the complex amplitude correction coefficients to supply adjusted nonlinear distortion components that have been adjusted for amplitude and phase;
   combining the adjusted nonlinear distortion components to supply corrections at an output; and,
   wherein subtracting the modified nonlinear distortion from the input digital signal includes subtracting accepted corrections from the input digital signal to supply the corrected input digital signal at an output.

18. The method of claim 17 wherein creating nonlinear distortion includes creating real nonlinear distortion components ($I_{DIS}$) and imaginary quadrature nonlinear distortion components ($Q_{DIS}$);
   wherein multiplying the complex amplitude correction coefficients by the nonlinear distortion includes adjusting the amplitude of the real nonlinear distortion components ($I_{DIS}$) in response to the real (Icor) correction coefficients and adjusting the amplitude of the imaginary quadrature nonlinear distortion components ($Q_{DIS}$) in response to the imaginary (Qcor) correction coefficients, to respectively supply amplitude adjusted real nonlinear distortion components ($I_{ADJ}$) and amplitude adjusted imaginary quadrature nonlinear distortion components ($Q_{ADJ}$);
   wherein combining the adjusted nonlinear distortion components includes combining the amplitude adjusted real nonlinear distortion components ($I_{ADJ}$) and combining the amplitude adjusted imaginary quadrature nonlinear distortion components CO to respectively supply combined amplitude adjusted real correction signal ($I_{COMB}$) and a combined amplitude adjusted imaginary quadrature correction signal ($Q_{COMB}$); and,
   wherein subtracting accepted corrections from the input digital signal includes subtracting the combined amplitude adjusted real correction signal ($I_{COMB}$) from the input digital signal.

19. The method of claim 18 creating a primary baseband signal includes creating the primary baseband signal at least partially in response to the combined amplitude adjusted imaginary quadrature correction signal ($Q_{COMB}$).

20. The method of claim 16 wherein accepting the input digital signal includes a method selected from the group consisting of using a digital down converter to accept a radio frequency (RF) digital signal or using a down-sampler to accept a baseband digital signal with real and imaginary quadrature components.

21. A signal distortion system comprising:
an IQ generator having an input to accept an input digital signal, and an output to supply a first-order real signal ($I_1$) and a first-order imaginary quadrature signal ($Q_1$);
a second-order generator having an input to accept $I_1$ and $Q_1$ and an output to supply real second order products $I_{2A}$ and $I_{2B}$, and an imaginary quadrature second order product $Q_{2B}$, where "A" and "B" represent, respectively, lower and upper sidebands of a signal in the frequency domain; and,
a third order generator having an input to accept $I_1$, $Q_1$, $I_{2B}$, and $Q_{2B}$, and an output to supply real third-order products $I_{3A}$ and $I_{3B}$, and imaginary third-order quadrature products $Q_{3A}$ and $Q_{3B}$.

22. The system of claim 21 wherein the second-order generator comprises:
a first mixer having inputs to accept $I_1$ and $Q_1$, and an output to supply a first product;
a 2× gain block having an input to accept the first product and an output to supply a second-order imaginary quadrature component $Q_{2B}$;
a second mixer having inputs to accept $I_1$ and an output to supply a second product $((I_1)^2)$;
a third mixer having inputs to accept $Q_1$ and an output to supply a third product $((Q_1)^2)$;
a first adder having inputs to subtract the third product from the second product, and an output to supply $I_{2B}$; and,
a second adder having inputs to accept the second and third products and an output to supply $I_{2A}$.

23. The system of claim 21 wherein the third-order generator comprises:
a fourth mixer having inputs to accept $I_1$ and $I_{2B}$, and an output to supply a fourth product;
a fifth mixer having inputs to accept $Q_1$ and $I_{2B}$, and an output to supply a fifth product;
a sixth mixer having inputs to accept $I_1$ and $Q_{2B}$, and an output to supply a sixth product;
a seventh mixer having inputs to accept $Q_1$ and $Q_{2B}$, and an output to supply a seventh product;
a third adder having inputs to subtract the seventh product from the fourth product, and an output to supply $I_{3A}$;
a first calculator having an input to accept $I_1$, and multiplying $I_1$ by a constant 1/sqrt(3) to supply an eighth product at an output;
a second calculator having an input to accept $Q_1$, and multiplying $Q_1$ by the constant 1/sqrt(3) to supply a ninth product at an output;
a fourth adder having inputs to subtract the eighth product from the seventh product and the fourth product, and an output to supply $I_{3B}$;
a fifth adder having inputs to accept a negative sixth product and a negative fifth product, and an output to supply $Q_{3A}$; and,
a sixth adder having inputs to add the fifth product, a negative sixth product, and a negative ninth product, and an output to supply $Q_{3B}$.

24. The system of claim 21 wherein the IQ generator comprises:
a delay unit to accept the input digital signal and an output to supply $I_1$; and,
a Hilbert transformer having an input to accept the input digital signal and an output to supply $Q_1$.

* * * * *

UNITED STATES PATENT AND TRADEMARK OFFICE
CERTIFICATE OF CORRECTION

PATENT NO.         : 11,444,819 B1
APPLICATION NO.    : 17/827730
DATED              : September 13, 2022
INVENTOR(S)        : Mikko Waltari It is certified that error appears in the above-identified patent and that said Letters Patent is hereby corrected as shown below:

In the Claims

In Column 14, Line 53, Claim 18, the term "CO" should be written as "$Q_{ADJ}$".

Signed and Sealed this
Eighth Day of November, 2022

*Katherine Kelly Vidal*

Katherine Kelly Vidal
*Director of the United States Patent and Trademark Office*